United States Patent
Kim et al.

(10) Patent No.: US 11,175,347 B2
(45) Date of Patent: Nov. 16, 2021

(54) DEVICE AND METHOD FOR DIAGNOSING BATTERY DETERIORATION

(71) Applicant: LG CHEM, LTD., Seoul (KR)

(72) Inventors: Ji Yeon Kim, Daejeon (KR); Yoon Jung Bae, Daejeon (KR)

(73) Assignee: LG Chem, Ltd., Seoul (KR)

( * ) Notice: Subject to any disclaimer, the term of this patent is extended or adjusted under 35 U.S.C. 154(b) by 239 days.

(21) Appl. No.: 16/606,996

(22) PCT Filed: Oct. 16, 2018

(86) PCT No.: PCT/KR2018/012166
§ 371 (c)(1),
(2) Date: Oct. 21, 2019

(87) PCT Pub. No.: WO2019/088504
PCT Pub. Date: May 9, 2019

(65) Prior Publication Data
US 2020/0081068 A1 Mar. 12, 2020

(30) Foreign Application Priority Data

Oct. 30, 2017 (KR) .................. 10-2017-0142607

(51) Int. Cl.
*G01R 31/392* (2019.01)
*G01R 31/3828* (2019.01)
(Continued)

(52) U.S. Cl.
CPC .............. *G01R 31/392* (2019.01); *B60L 3/04* (2013.01); *B60L 50/66* (2019.02); *B60L 58/16* (2019.02);
(Continued)

(58) Field of Classification Search
CPC ... G01R 31/392; G01R 31/3828; B60L 58/16; B60L 50/66; B60L 3/04; H01M 10/46; H01M 10/48; H01M 2220/20; H02J 7/00
(Continued)

(56) References Cited

U.S. PATENT DOCUMENTS 6,424,157 B1 * 7/2002 Gollomp ............... B60L 3/0046
324/430
2010/0201323 A1 8/2010 Okamura
(Continued)

FOREIGN PATENT DOCUMENTS

EP        1 598 913 A2    11/2005
JP        2001-332310 A   11/2001
(Continued)

OTHER PUBLICATIONS

Extended European Search Report issued by the European Patent Office dated Mar. 4, 2020 in a corresponding European Patent Application No. 18874145.
(Continued)

*Primary Examiner* — Nathaniel R Pelton
(74) *Attorney, Agent, or Firm* — Morgan, Lewis & Bockius LLP

(57) ABSTRACT

The present invention relates to a device and a method for diagnosing battery deterioration, the device comprising: a battery comprising at least one cell; a charging unit for charging the cell, and performing cut-off during a stabilization time in which the charged cell is stabilized; a sensing unit for measuring a current of the cell with respect to time; and a control unit for, by using the measured current, detecting an inflection point of the measured current, calculating a slope of the measured current in a first period after a time corresponding to the inflection point; and comparing the current slope of a reference cell, corresponding to the
(Continued)

slope of the measured current, so as to diagnose whether the cell has deteriorated.

11 Claims, 3 Drawing Sheets

(51) Int. Cl.
    *B60L 50/60*        (2019.01)
    *B60L 58/16*        (2019.01)
    *B60L 3/04*         (2006.01)
    *H01M 10/46*       (2006.01)
    *H01M 10/48*       (2006.01)
    *H02J 7/00*        (2006.01)

(52) U.S. Cl.
    CPC ........ *G01R 31/3828* (2019.01); *H01M 10/46* (2013.01); *H01M 10/48* (2013.01); *H01M 2220/20* (2013.01); *H02J 7/00* (2013.01)

(58) Field of Classification Search
    USPC ......................................................... 324/426
    See application file for complete search history.

(56) References Cited

U.S. PATENT DOCUMENTS

| | | |
|---|---|---|
| 2013/0253730 A1 | 9/2013 | Sato et al. |
| 2014/0019790 A1* | 1/2014 | Bhardwaj ................. G06F 1/28 713/340 |
| 2015/0293181 A1 | 10/2015 | Kaneno et al. |
| 2015/0316636 A1* | 11/2015 | Nishijima .......... G01R 31/3842 702/58 |
| 2017/0054134 A1 | 2/2017 | Choi et al. |

FOREIGN PATENT DOCUMENTS

| | | |
|---|---|---|
| JP | 2008080963 A | 4/2008 |
| JP | 2010-186619 A | 8/2010 |
| JP | 2014-071098 A | 4/2014 |
| JP | 2014-081258 A | 5/2014 |
| JP | 2014-178324 A | 9/2014 |
| KR | 10-2001-0082115 A | 8/2001 |
| KR | 10-2013-0136800 A | 12/2013 |
| KR | 10-2017-0022417 A | 3/2017 |

OTHER PUBLICATIONS

International Search Report issued in corresponding International Patent Application No. PCT/KR2018/012166, dated Jan. 28, 2019.

* cited by examiner

[Fig. 1]
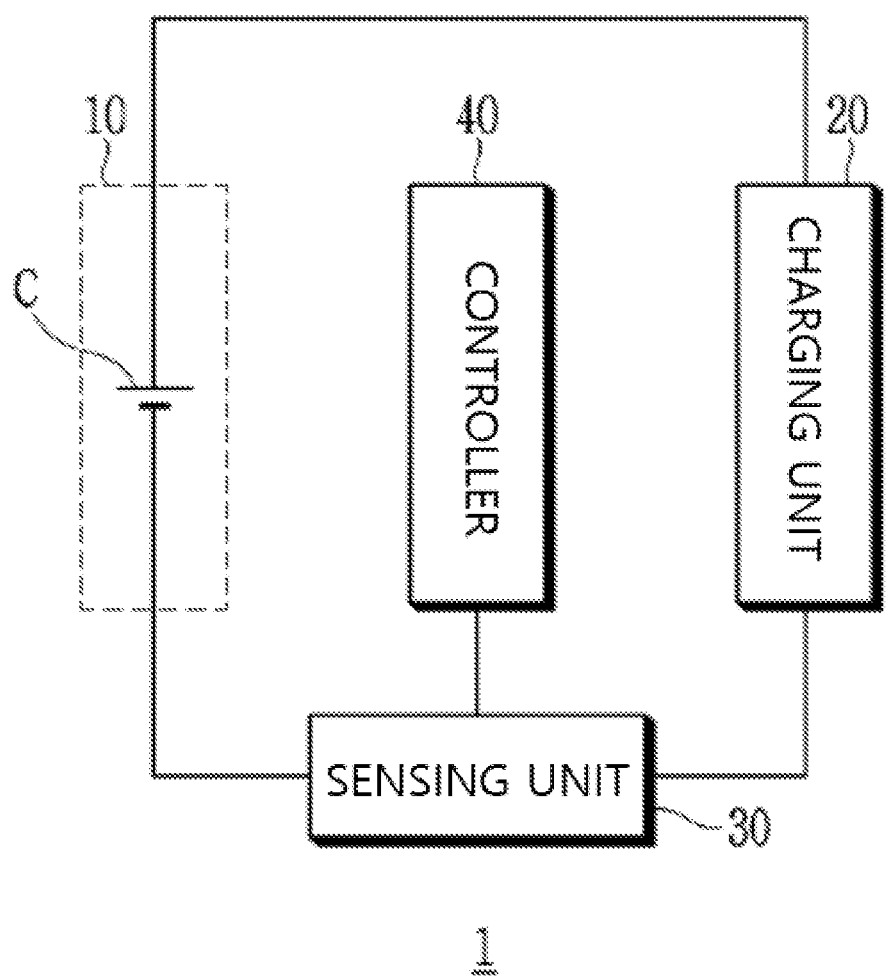

[Fig. 2]
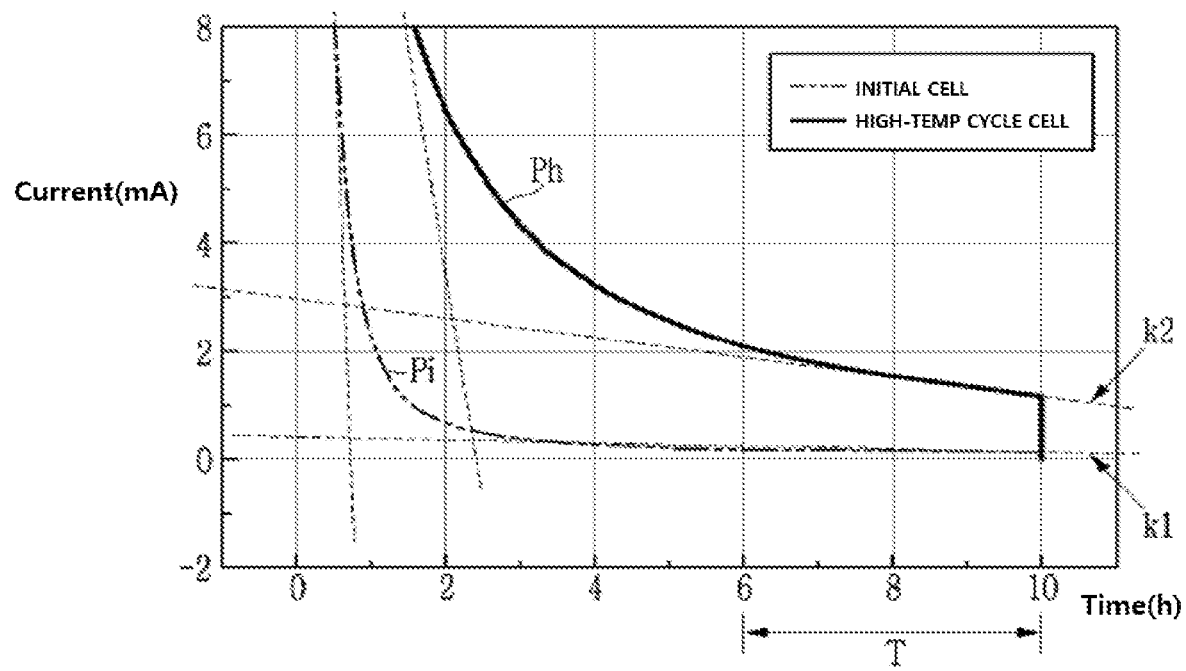

[Fig. 3]
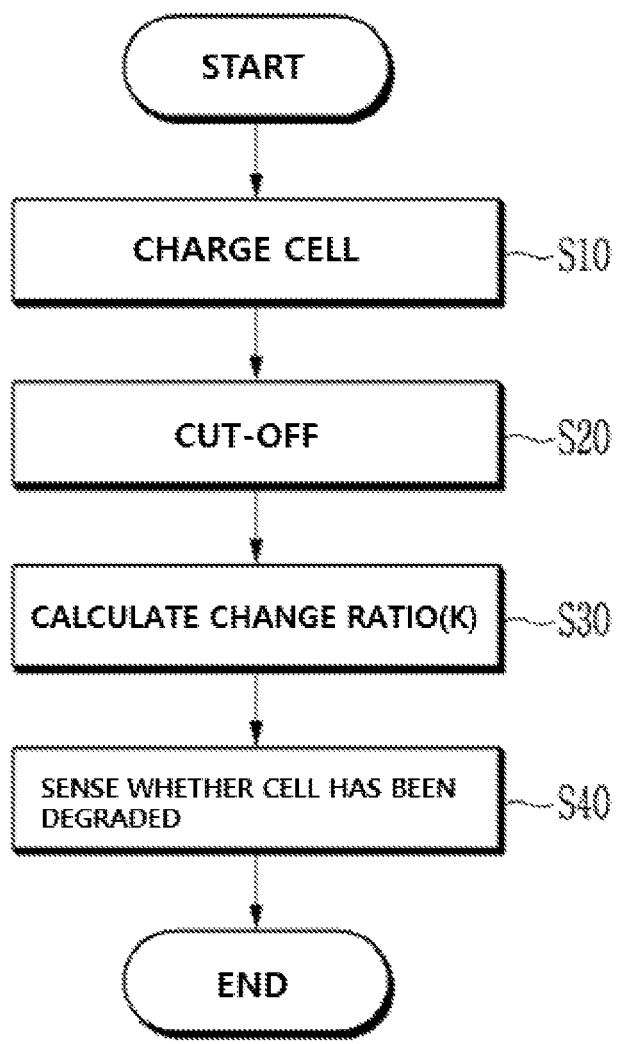

DEVICE AND METHOD FOR DIAGNOSING BATTERY DETERIORATION

TECHNICAL FIELD

This application claims the benefit of priority based on Korean Patent Application No. 10-2017-0142607, filed on Oct. 30, 2017, and the entire contents of the Korean patent application are incorporated herein by reference.

The present invention relates to a battery field, and more particularly, to an apparatus and method for diagnosing a battery degradation.

BACKGROUND ART

Generally, an electric vehicle or a hybrid electric vehicle drives an automobile using electric energy stored in a battery in an electric driving mode.

At this time, used batteries can generally has high applicability, batteries having an electrical characteristic such as a high energy density has primary advantages that a storage battery or a secondary battery is used and the use of fossil fuel can be reduced and has an advantage that there are no by-products from the use of energy. As such, the batteries are attracting attention as a new energy source for environment-friendliness and energy efficiency improvement.

Therefore, a battery is generally applied to an electric vehicle (EV) driven by an electric driving source as well as a portable device, or an energy storage system (ESS), and research and development on battery management system (BMS), battery balancing circuit and relay circuit have been actively carried out for more efficient battery management.

Particularly, in the case of a lithium battery applied to an ESS (energy storage system), a long life characteristic is required. However, when the lithium battery experiences hundreds of cycles, gas generation, lithium plating, electrolyte decomposition, by-product accumulation, and a sudden drop phenomenon such as instantaneous voltage drop occur. Therefore, there is a need for a method of distinguishing whether the secondary battery is degraded before a sudden drop occurs during the cycle of the lithium secondary battery.

In recent years, batteries used in electric vehicles have been reused as batteries for ESS for saving. Therefore, it is important to diagnose the state of health of the battery.

DISCLOSURE

Technical Problem

It is an object of the present invention to provide an apparatus and method for diagnosing battery degeneration.

It is another object of the present invention to provide a battery degeneration diagnostic apparatus and method capable of measuring the degree of degeneration of a battery by measuring a minute current of the battery cell.

It is another object of the present invention is to provide an apparatus and method for distinguishing whether a battery is degraded before a sudden drop occurs during a cycle of the battery.

Technical Solution

According to an aspect of the present invention, there is provided an apparatus for diagnosing battery degradation, including: a battery including at least one cell; a charging unit configured to charge the cell and perform a cut-off during a stabilization time when the charged cell is stabilized; a sensing unit configured to measure a current of the cell with respect to time; and a controller configured to detect an inflection point of the measured current by using the measured current, calculate a slope of the measured current during a first period after a time point corresponding to the inflection point, and diagnosing whether the cell has degraded by comparing the slope of the measured current with a slope of a reference cell, wherein the reference cell is a cell which has not been degraded.

Herein, the current of the cell may be greater than 0 mA during the stabilization time.

Herein, the sensing unit may measure a flowing current of the full-charged cell in mA units with respect to time.

Herein, the controller may compare an absolute value of the slope of the measured current with an absolute value of the slope of the current of the reference cell, and if the absolute value of the slope of the measured current is greater than the absolute value of the slope of the current of the reference cell, the controller may diagnose that the cell has been degraded.

Herein, stabilization time of the cell may be longer than stabilization time of the reference cell.

Further, according to another aspect of the present invention, there is provided a method of diagnosing degradation of a battery including at least one cell, including: charging the cell and performing a cut-off during a stabilization time when the charged cell is stabilized; measuring a current of the cell with respect to time; detecting an inflection point of the measured current by using the measured current and calculating a slope of the measured current during a first period after a time point corresponding to the inflection point; and diagnosing whether the cell has degraded by comparing the slope of the measured current with a slope of a reference cell, wherein the reference cell is a cell which has not been degraded.

Herein, the current of the cell may be greater than 0 mA during the stabilization time.

Herein, the measuring of the current may include measuring a flowing current of the full-charged cell in mA units with respect to time.

Herein, the diagnosing may include: comparing an absolute value of the slope of the measured current with an absolute value of the slope of the current of the reference cell; and diagnosing that the cell has been degraded if the absolute value of the slope of the measured current is greater than the absolute value of the slope of the current of the reference cell.

Herein, stabilization time of the cell may be longer than stabilization time of the reference cell.

Advantageous Effects

According to the present invention, it is possible to provide an apparatus and method for diagnosing battery degeneration.

Further, according to the present invention, it is possible to provide a battery degeneration diagnosis apparatus and method capable of measuring the degree of degeneration of a battery by measuring a minute current of the battery cell.

Further, according to the present invention, it is possible to provide an apparatus and method for distinguishing whether a battery is degraded before a sudden drop occurs during a cycle of the battery.

BRIEF DESCRIPTION OF THE DRAWINGS

FIG. 1 is a block diagram showing a configuration of a battery degeneration diagnosis apparatus according to an embodiment of the present invention.

FIG. 2 is a time (h)-current (mA) graph of a cell according to an embodiment of the present invention.

FIG. 3 is a flowchart of a battery degradation diagnosis method according to another embodiment of the present invention.

DETAILED DESCRIPTION OF THE PREFERRED EMBODIMENTS

Hereinafter, an apparatus and method for diagnosing a battery degradation according to the present invention will be described in detail.

FIG. 1 is a block diagram showing a configuration of a battery degeneration diagnosis apparatus according to an embodiment of the present invention.

Hereinafter, a battery degradation diagnosis apparatus according to the present invention will be described with reference to FIG. 1.

Referring to FIG. 1, a battery degeneration diagnosis apparatus 1 according to the present invention includes a battery 10, a charging unit 20, a sensing unit 30, and a controller 40.

The battery 10 includes at least one cell c, for example a unit cell or a mono cell, and is connected to the charging unit 20. The cell (c) is charged or discharged by the charging unit 20.

The charging unit 20 charges the cell (c).

More specifically, the charging unit 20 charges the cell c with a state of charge (SOC) of 0 (SOC0) in a constant current mode at a predetermined C-rate, and when the voltage of the cell c measured through the sensing unit 30 corresponds to the end-of-charge voltage, the cell c can be charged by a constant voltage by switching to a constant voltage mode.

Here, C-rate is the current rate, which is a unit for predicting or indicating the current value setting and the usable time of the cell (c) under various usage conditions during charging/discharging of the cell (c), and the setting of the C-rate value can be determined according to various factors such as the capacity of the battery, loading, and the like.

Also, the charging unit 20 may perform a time cut-off for a stabilization time, for example, 10 hours during which the cell c can be sufficiently stabilized, instead of a current cut-off at the constant voltage mode. Here, the stabilization time may be a time for stabilizing the current, voltage and capacity of the cell c, which are fluctuated. At this time, the stabilization time prevents the current of the cell c from becoming 0 mA.

In the case of an initial cell (non-degraded cell, hereinafter referred to as a reference cell (not shown)), no current flows when the cell reaches the stabilization time, which is the time required to reach a fully stabilized state (at this time, current is 0 mA), but as the number of times of charging and discharging of the cell (c) increases and the cycle of the cell (c) is repeated (i.e., the cell in the high temperature cycled state), the stabilization time of the cell (c) in the constant voltage mode becomes longer than the stabilization time of the reference cell. Therefore, in the case of the degraded cell, a residual current flows even during the stabilization time. Hereinafter, cell c is assumed to be a high-temperature cycle cell.

Therefore, it is possible to diagnose whether the cell c is degraded by using the time (h) versus current (mA) curve of the cell c at the stabilization time. A specific method for diagnosing the degradation of the cell c according to the embodiment of the present invention will be described later.

Although the charging unit 20 has been described for charging the cell c in a constant current mode-constant voltage mode charging scheme (CCCV charging scheme), the charging mode of the present invention is not limited thereto.

The sensing unit 30 measures the current (e.g., the floating current) of the reference cell and the cell c in a fine region (for example, mA units may be used, but not limited thereto), and the measured current is transmitted to the controller 40.

Specifically, the current of the reference cell in the charged state is measured in units of mA only in the stabilization time of the sensing unit 30, the current of the cell c in the charged state is measured in units of mA, and the measured results are delivered to the controller 40.

The sensing unit 30 may be an EC-lab equipment, but the present invention is not limited thereto.

The controller 40 diagnoses whether the cell c is degraded by using the measurement currents of the reference cell and the cell c.

Hereinafter, a specific method for diagnosing whether or not the cell c is degraded by the control unit 40 according to the present invention will be described with reference to FIG. 2.

FIG. 2 is a graph showing the current in cell c according to an embodiment of the present invention.

The controller 40 detects the inflection points Pi and Ph of the reference cell and the cell c using the time (h)-current (mA) graph of the cell c, calculates the current slopes K1 and K2 of the reference cell and the cell c measured in the cell during the diagnosis period T after the time corresponding to the inflection point, and diagnoses whether the cell c has been degraded according to the calculation result.

At this time, the slope (K: K1, K2) can be calculated by the following equation 1.

$$K = \text{current}/\text{time} \qquad \text{[Equation 1]}$$

Specifically, the controller 40 detects the inflection point Pi of the reference cell in the time (h)-current (mA) graph of the cell c during the stabilization time 10 h, and calculates the slope K1 which is the amount of current change of the reference cell during the diagnosis period T after the time corresponding to the inflection point Pi.

The controller 40 also detects the inflection point Ph of the cell c in the time (h)-current (mA) graph during the stabilization time 10 h, calculates the slope K2 which is the current change amount of the cell c with respect to the diagnosis period T after the time corresponding to the inflection point Ph.

Thereafter, the controller 40 compares the absolute value of the slope K2 of the cell c with the absolute value of the slope K1 of the reference cell, and if the absolute value of the slope K2 of the cell c is larger than the absolute value of the slope K1 of the reference cell, the cell c is diagnosed as a cell in which degradation has progressed. Further, the controller 40 diagnoses the degree of degradation of the cell c in proportion to the absolute value of the slope K2 of the cell c.

As described above, in the case of the reference cell, the current does not flow when the stabilization time is reached, but when the cycle of the cell is repeated by the increase of the number of times of charging and discharging of the cell, the stabilization time of the cell c becomes longer than that of the reference cell. Therefore, in the case of the cell c, the residual current flows even during the stabilization time, so that the absolute value of the slope K2 of the degraded cell c becomes larger than the absolute value of the slope K1 of the reference cell, and the greater the absolute value of the slope K2 of the cell c, the greater the degradation degree of the cell c.

Although it has been described above that the sensing unit 30 measures the current of the reference cell, the information about the current of the reference cell may be stored in advance in the controller 40, and the present invention is not limited thereto.

It has been explained that the sensing unit 30 and the controller 40 are separately configured, but the sensing unit 30 and the controller 40 may be integrated, and the present invention is not limited thereto.

FIG. 3 is a flowchart of a battery degradation diagnosis method according to an embodiment of the present invention.

Hereinafter, a battery degradation diagnosis method according to an embodiment of the present invention will be described with reference to FIG. 3.

In step S10, the charging unit 20 charges the cell c in a constant current mode and a constant voltage mode.

A specific method of charging the cell c by the charger 20 will be described with reference to FIG. 1, and a detailed description thereof will be omitted here.

In step S20, the charging unit 20 performs a time cut-off to the cell c during the stabilization time in the constant voltage mode.

The details of performing the time cutoff to the cell c during the stabilization time in the constant voltage mode by the charging unit 20 will be described with reference to FIG. 1, and a detailed description thereof will be omitted here.

In step 30, the controller 40 detects the inflection points Pi and Ph of the cell using the time (h)-current (mA) graph of the cell, and calculates the slope (K1, K2) of the cell during the diagnosis period (T) after the time corresponding to the inflection point as shown in FIG. 2.

The details of how the controller 40 calculates the slopes K1 and K2 of the cell will be described with reference to FIG. 2, and a detailed description thereof will be omitted here.

In step S40, the controller 40 compares the absolute value of the slope K2 of the cell c with the absolute value of the slope K1 of the reference cell, and if the absolute value of the slope K2 of the cell c is larger than the absolute value of the slope K1 of the reference cell, the cell c is diagnosed as a cell in which degradation has progressed.

The details of the diagnosis of the degradation of the cell by the controller 40 will be described with reference to FIG. 2, and a detailed description thereof will be omitted here.

The invention claimed is:

1. An apparatus for diagnosing battery degradation, the apparatus comprising:
 a battery including at least one cell;
 a charging unit configured to charge the cell and perform a cut-off during a stabilization time when the charged cell is stabilized;
 a sensing unit configured to measure a current of the cell with respect to time; and
 a controller configured to detect an inflection point of the measured current by using the measured current, calculate a slope of the measured current during a first period after a time point corresponding to the inflection point, and diagnosing whether the cell has degraded by comparing the slope of the measured current with a slope of a reference cell,
 wherein the reference cell is a cell which has not been degraded.

2. The apparatus of claim 1, wherein the current of the cell is greater than 0 mA during the stabilization time.

3. The apparatus of claim 2, wherein the sensing unit measures a flowing current of the full-charged cell in mA units with respect to time.

4. The apparatus of claim 3, wherein the controller compares an absolute value of the slope of the measured current with an absolute value of the slope of the current of the reference cell, and if the absolute value of the slope of the measured current is greater than the absolute value of the slope of the current of the reference cell, the controller diagnoses that the cell has been degraded.

5. The apparatus of claim 4, wherein the stabilization time of the cell is longer than stabilization time of the reference cell.

6. A method of diagnosing degradation of a battery including at least one cell, the method comprising:
 charging the cell and performing a cut-off during a stabilization time when the charged cell is stabilized;
 measuring a current of the cell with respect to time;
 detecting an inflection point of the measured current by using the measured current and calculating a slope of the measured current during a first period after a time point corresponding to the inflection point; and
 diagnosing whether the cell has degraded by comparing the slope of the measured current with a slope of a reference cell,
 wherein the reference cell is a cell which has not been degraded.

7. The method of claim 6, wherein the current of the cell is greater than 0 mA during the stabilization time.

8. The method of claim 7, wherein the measuring of the current includes measuring a flowing current of a full-charged cell in mA units with respect to time.

9. The method of claim 8, wherein the diagnosing includes: comparing an absolute value of the slope of the measured current with an absolute value of the slope of the current of the reference cell; and
 diagnosing that the cell has been degraded if the absolute value of the slope of the measured current is greater than the absolute value of the slope of the current of the reference cell.

10. The method of claim 9, wherein the stabilization time of the cell is longer than stabilization time of the reference cell.

11. The method of claim 6, wherein the charging comprises charging the cell in a constant current mode and a constant voltage mode.

* * * * *